(12) United States Patent
Okabe et al.

(10) Patent No.: US 10,784,466 B2
(45) Date of Patent: Sep. 22, 2020

(54) METHOD OF MANUFACTURING DISPLAY DEVICE

(71) Applicant: Sharp Kabushiki Kaisha, Sakai, Osaka (JP)

(72) Inventors: Tohru Okabe, Sakai (JP); Ryosuke Gunji, Sakai (JP); Hiroki Taniyama, Sakai (JP); Shinsuke Saida, Sakai (JP); Shinji Ichikawa, Sakai (JP); Akira Inoue, Sakai (JP); Hiroharu Jinmura, Sakai (JP); Yoshihiro Nakada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/467,508

(22) PCT Filed: Jul. 31, 2017

(86) PCT No.: PCT/JP2017/027767
§ 371 (c)(1),
(2) Date: Jun. 7, 2019

(87) PCT Pub. No.: WO2019/026155
PCT Pub. Date: Feb. 7, 2019

(65) Prior Publication Data
US 2020/0044192 A1 Feb. 6, 2020

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3244* (2013.01); *H01L 51/56* (2013.01)

(58) Field of Classification Search
CPC ............. H01L 2227/326; H01L 51/003; B32B 2307/748; B32B 3/263; B32B 43/006
See application file for complete search history.

(56) References Cited

U.S. PATENT DOCUMENTS

| | | | |
|---|---|---|---|
| 2010/0203296 A1 | 8/2010 | Tsai et al. | |
| 2013/0015329 A1 | 1/2013 | Iwaki | |
| 2015/0044442 A1 | 2/2015 | Huang et al. | |
| 2017/0005293 A1* | 1/2017 | Kim | ......... H01L 51/56 |

FOREIGN PATENT DOCUMENTS

| | | |
|---|---|---|
| JP | 2011-234326 A | 11/2011 |
| JP | 2013-026546 A | 2/2013 |
| JP | 2013-135180 A | 7/2013 |
| JP | 2013-135181 A | 7/2013 |

(Continued)

OTHER PUBLICATIONS

Official Communication issued in International Patent Application No. PCT/JP2017/027767, dated Oct. 24, 2017.

*Primary Examiner* — Alia Sabur
(74) *Attorney, Agent, or Firm* — Keating & Bennett, LLP

(57) ABSTRACT

A portion of a resin film is precisely cut out when the resin film is peeled off. A rear surface of a glass substrate on which a protrusion is formed is irradiated with a laser beam to peel a resin film from the glass substrate. Then, the protrusion and the resin film formed on the protrusion are left on the glass substrate.

10 Claims, 8 Drawing Sheets

(56) References Cited

FOREIGN PATENT DOCUMENTS

| JP | 2013135180 A | * | 7/2013 | |
|---|---|---|---|---|
| JP | 2014-086451 A | | 5/2014 | |
| JP | 2015-037075 A | | 2/2015 | |
| JP | WO2016046997 A1 | * | 4/2017 | ............ B32B 17/00 |
| WO | 2012/046428 A1 | | 4/2012 | |
| WO | 2016/046997 A1 | | 3/2016 | |

* cited by examiner

METHOD OF MANUFACTURING DISPLAY DEVICE

TECHNICAL FIELD

The disclosure relates to a method of manufacturing a display device and relates to a display device.

BACKGROUND ART

PTL 1 discloses a method including a step of forming an adhesive layer of a predetermined pattern on a rigid carrier, a step of forming a flexible substrate layer on the rigid carrier, wherein a portion of the flexible substrate layer forms a first contact interface in contact with the rigid carrier and the remaining portion of the flexible substrate layer forms a second contact interface in contact with the adhesive layer, a step of forming at least one device on the surface of the flexible substrate layer on the side opposite the first contact interface, and a step of separating the flexible substrate from the rigid carrier through the first contact interface.

CITATION LIST

Patent Literature

PTL 1: JP 2011-234326 A (Pub. Date: Nov. 17, 2011)

SUMMARY

Technical Problem

In the configuration disclosed in PTL 1, the remaining portion might not be precisely cut out when separating the flexible substrate.

An object of the disclosure is to solve the problems including precisely cutting out a portion of a resin film when the resin film is peeled off.

Solution to Problem

To solve the problems, a method of manufacturing a display device according to an aspect of the disclosure includes forming a protrusion composed of a first material in a portion on a glass substrate; forming a resin film composed of a second material on the glass substrate and the protrusion, the second material being different from the first material; forming a TFT layer on the resin film; forming a display element layer on the TFT layer; forming a sealing film on the display element layer; and peeling the resin film from the glass substrate by irradiating a rear surface of the glass substrate with a laser beam, wherein the peeling includes leaving the protrusion and the resin film formed on the protrusion on the glass substrate.

Advantageous Effects of Disclosure

According to an aspect of the disclosure, when a resin film is peeled off, a portion of the film can be precisely cut out.

DESCRIPTION OF EMBODIMENTS

Planar Configuration of Display Device 1

Figure 1A:
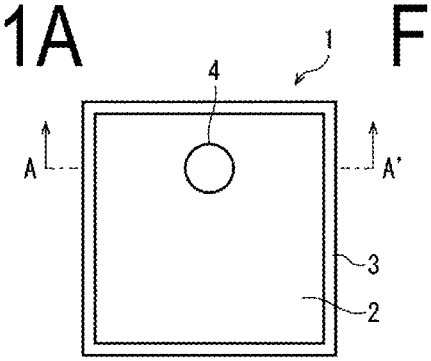
FIGS. 1A and 1B are plan views illustrating configurations of a display device according to an embodiment of the disclosure.
Figure 1B:
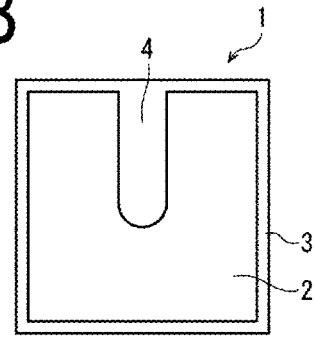

FIGS. 1A and 1B are plan views illustrating configurations of a display device 1 according to an embodiment of the disclosure. The display device 1 is a self-luminous display device and is configured as an organic EL light-emitting device, for example. As illustrated in FIGS. 1A and 1B, the display device 1 includes a display region 2 and a frame region 3 surrounding the display region 2. A blank portion 4 is formed inside the display region 2. The display region 2 has a capability of displaying information, and the blank portion 4 does not have a display capability. The shape and the position of the blank portion 4 are appropriately determined in accordance with the difference in the form of the design required for the display device 1. The blank portion 4 has a substantially circular shape in FIG. 1A, and the blank portion 4 has a cut-out shape extending from the frame region 3 to an approximate center of the display region 2 in FIG. 1B.

Cross-Sectional Configuration of Display Device 1

Figure 2:
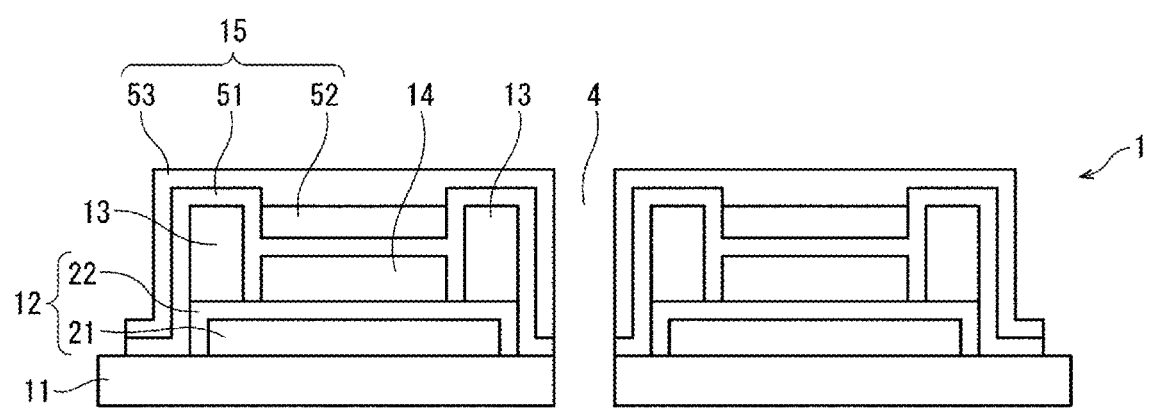
FIG. 2 is a sectional view of the display device taken along line A-A' illustrated in FIG. 1A.

FIG. 2 is a sectional view of the display device 1 along the line A-A' illustrated in FIG. 1A. The display device 1 is achieved as a top-emitting display device that emits light upward. As illustrated in FIG. 2, the display device 1 includes, from the lower side, a resin film 11, a TFT layer 12, a bank 13, a display element layer 14, and a sealing film 15.

The material of the resin film 11 is a resin such as polyimide, epoxy, and polyamide. The resin film 11 is composed of a resin and is therefore flexible.

The TFT layer 12 is composed of a semiconductor layer 21 and an inorganic film 22. The semiconductor layer 21 is composed of a TFT for driving the display element layer 14. The inorganic film 22 electrically separates the semiconductor layer 21 from the display element layer 14.

When a liquid material of a resin film 52 that constitutes the sealing film 15 is applied to the entire surface of the display element layer 14, the bank 13 restricts wet-spreading of the liquid material beyond the TFT layer 12. The bank 13 is formed around the display element layer 14 on the surface of the TFT layer 12 before applying the liquid material.

The display element layer 14 is a layer in which a plurality of light-emitting elements, which self-emit light when a voltage is applied thereto, are formed in a predetermined plane pattern (such as a matrix). The light-emitting element is an organic EL element, for example. Alternatively, the light-emitting element may be an inorganic light-emitting element or a quantum dot light-emitting element.

The sealing film 15 is composed of an inorganic film 51 (first inorganic film), the resin film 52 (interlayer resin film) and an inorganic film 53 (second inorganic film). The sealing film 15 seals the TFT layer 12, the bank 13 and the display element layer 14. The sealing film 15 seals the display element layer 14a by thin-film encapsulation (TFE) and thus prevents deterioration of the light-emitting element due to moisture and oxygen permeated from the outside.

Method of Manufacturing Display Device 1

Figure 3A:
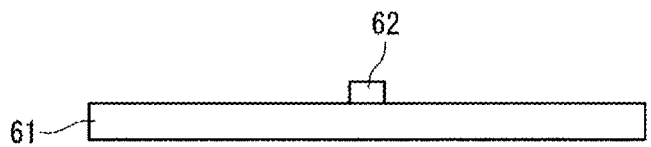
FIGS. 3A to 3E illustrate a method of manufacturing the display device.

FIGS. 3A to 3E illustrate a method of manufacturing the display device 1. First, as illustrated in FIG. 3A, a protrusion 62 is formed on a part of the surface of a glass substrate 61. As described in detail later, in this step, the protrusion 62 is formed between each of the different bank 13 in different display devices 1 on the glass substrate 61. The formation of the protrusion 62 is controlled such that the position of the protrusion 62 corresponds to the blank portion 4 in the display device 1.

The material (first material) of the protrusion 62 may be any material different from the material of (second material) the resin film 11. For example, when the material of the resin film 11 is polyimide, the material of the protrusion 62 is any resin different from polyimide. Preferably, the material of the protrusion 62 is a metal regardless of the material of the resin film 11.

Formation of Resin Film 11

Figure 3B:
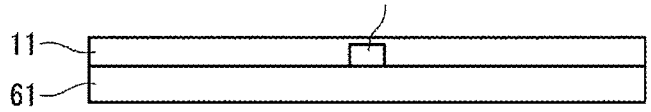

After the protrusion 62 is formed, the resin film 11 is formed on the surface of the glass substrate 61 as illustrated in FIG. 3B. Preferably, the resin film 11 overlapping the protrusion 62 is to be as thin as possible. To achieve such formation, the protrusion 62 having a sufficient thickness slightly thinner than the average thickness of the resin film 11 is formed on the glass substrate 61, for example. In this manner, naturally, the resin layer above the protrusion 62 is thinned in the formation of the resin film 11. The less the thickness of the portion of the resin film 11 overlapping the protrusion 62 is, the more easily the portion can be cut out from the main body of the resin film 11.

Figure 3C:
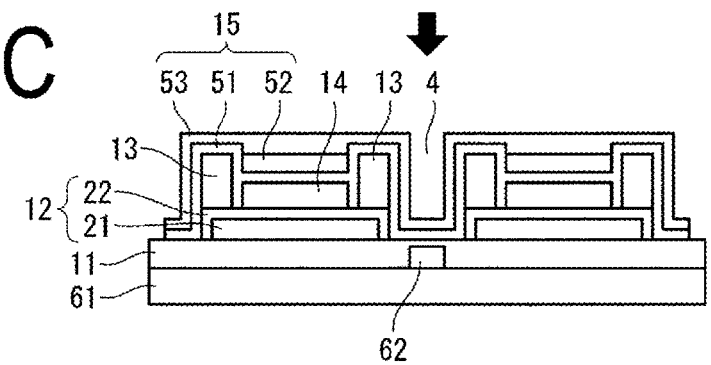

After the resin film 11 is formed, the TFT layer 12, the bank 13, the display element layer 14, and the sealing film 15 are sequentially formed on the resin film 11 as illustrated in FIG. 3C. First, the TFT layer 12 including the semiconductor layer 21 and the inorganic film 22 is formed on the resin film 11. The step of forming the TFT layer 12 includes a step of forming the bank 13 on the TFT layer 12. A plurality of the banks 13 are formed at positions where the display element layer 14 can be surrounded. The bank 13 serves a function of stemming the resin film 52 in the formation of the sealing film 15. An end portion of the display region 2 is opposite the bank 13. After the bank 13 is formed, the display element layer 14 is formed at a position surrounded by the bank 13. After the display element layer 14 is formed, the sealing film 15 is formed on the display element layer 14.

The step of forming the sealing film 15 includes a step of forming the inorganic film 51, a step of forming the resin film 52 in an ink-jet manner, and a step of forming the inorganic film 53. The forming of the sealing film 15 includes, first, forming the inorganic film 51 on the bank 13 and the display element layer 14, then forming the resin film 52 on the inorganic film 51, and finally forming the inorganic film 53 on the resin film 52. The inorganic film 51 and the inorganic film 53 are formed also on the resin film 11 formed on the protrusion 62.

Peeling of Resin Film 11

Figure 3D:
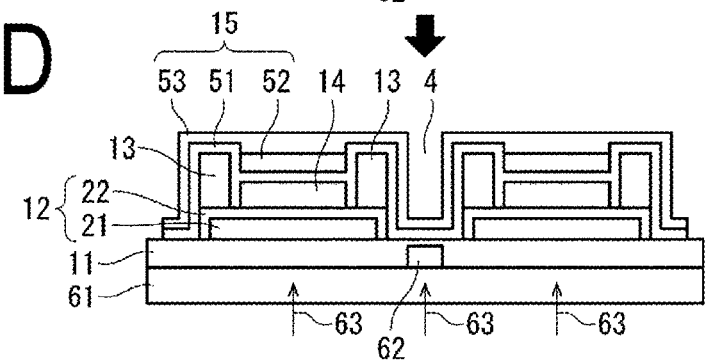

After the sealing film 15 is formed, the rear surface of the glass substrate 61 is irradiated with a laser beam 63 as illustrated in FIG. 3D. The directed laser beam sufficiently reaches the rear surface of the resin film 11 directly adjoining the glass substrate 61. As a result, the adhesion of the resin film 11 to the glass substrate 61 is reduced at the portion irradiated with the laser beam 63. Meanwhile, the laser beam 63 directed to the position of the protrusion 62 in the glass substrate 61 hits the protrusion 62 and therefore does not sufficiently reaches the resin film 11 overlapping the protrusion 62. As a result, the adhesion to the protrusion 62 at the resin film 11 overlapping the protrusion 62 is kept at a high level. In the case that the material of the protrusion 62 is a metal, irradiation of the resin film 11 overlapping the protrusion 62 with the laser beam can be surely prevented, and therefore the resin film 11 overlapping the protrusion 62 can be more easily cut out.

Figure 3E:
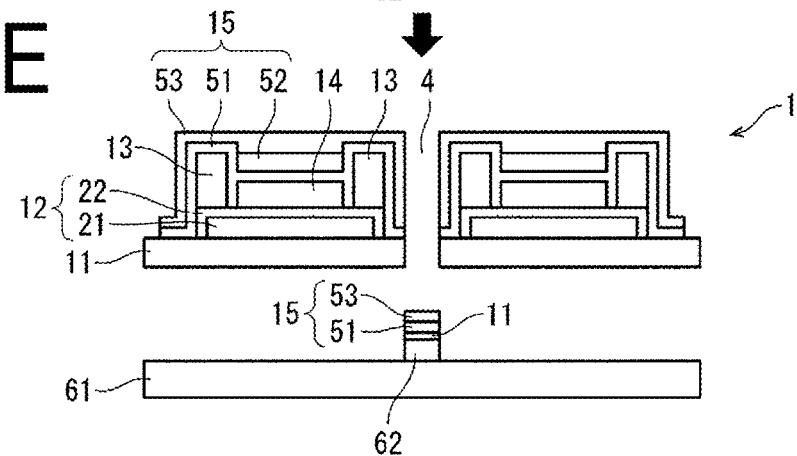

By the irradiation with the laser beam 63, the resin film 11 can be peeled from the glass substrate 61 as illustrated in FIG. 3E. At this time, the adhesion to the glass substrate 61 at the resin film 11 directly adjoining the glass substrate 61 has been reduced, and therefore the resin film 11 is easily peeled from the glass substrate 61. Meanwhile, the adhesion to the protrusion 62 at the resin film 11 overlapping the protrusion 62 is kept at a high level, and therefore the resin film 11 overlapping the protrusion 62 is left on the protrusion 62. As a result, the protrusion 62 and the resin film 11 overlapping the protrusion 62 are left on the glass substrate 61. Also, the inorganic film 51 and the inorganic film 53 overlapping the protrusion 62 are left on the glass substrate 61.

The resin film 11 formed on the protrusion 62 is sufficiently thin, and therefore, when the resin film 11 is peeled from the glass substrate 61, the portion left on the protrusion 62 is easily cut out from the main body of the resin film 11 without being stretched. As a result, when peeling the resin film 11 from the glass substrate 61, a portion (corresponding to the protrusion 62) of the resin film 11 can be precisely left on the glass substrate 61. Thus, the display device 1 in which the blank portion 4 is formed at a position corresponding to the protrusion 62 is manufactured as illustrated in FIGS. 1A and 1B.

In the formation of the resin film 11, it is preferable to form the resin film 11 such that the thickness of the resin film 11 overlapping the protrusion 62 is 0.5 μm or smaller. With such a configuration, the resin film 11 can be easily peeled from the glass substrate 61.

As described above, the method of manufacturing the display device 1 does not include a step of irradiating the display device 1 with a laser beam having a high temperature to cut out a portion of the resin film 11 by the heat of the laser beam. Therefore, burning of the periphery of the blank portion 4, cracking in the display device 1, or damage to the display element layer 14 is not caused. Thus, the display device 1 with higher quality can be manufactured.

Formation Position of Protrusion 62

Figure 4A:
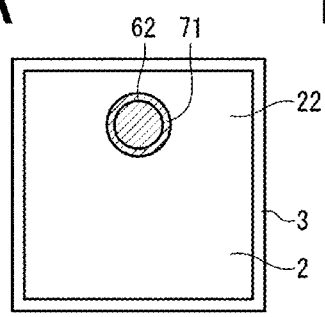
FIGS. 4A and 4B illustrate examples of formation positions of a protrusion.
Figure 4B:
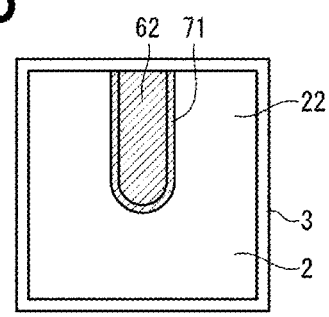

FIGS. 4A and 4B illustrate examples of formation positions of the protrusion 62. In FIG. 4A, the forming of the protrusion 62 includes forming the protrusion 62 inside the display region 2. Specifically, the forming of the protrusion 62 includes forming the protrusion 62 having a substantially circular shape. In this manner, the display device 1 including the blank portion 4 having a substantially circular shape inside the display region 2 as illustrated in FIG. 1A can be manufactured.

In FIG. 4B, the forming of the protrusion 62 includes forming the protrusion 62 cut out from the frame region 3 to the display region 2. In this manner, the display device 1 including, in the display region 2, the blank portion 4 cut out from the frame region 3 into the display region 2 as illustrated in FIG. 1B can be manufactured.

In FIG. 4A or 4B, in the formation of the TFT layer 12, the inorganic film 22 including an opening 71 at the position corresponding to the end portion of the protrusion 62 is formed. In this case, the end portion of the protrusion 62 does not overlap the inorganic film 22. Thus, when the resin film 11 is peeled off, it is not necessary to cut out the inorganic film 22. Therefore, when the resin film 11 is peeled off, it is possible to prevent cracking in the inorganic film 22 and propagation of such cracking to the display region 2.

Figure 5A:
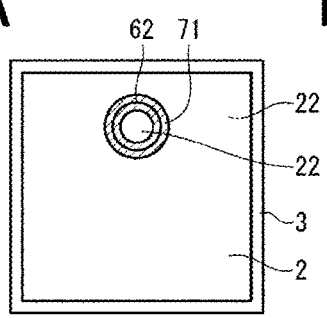
FIGS. 5A and 5B are plan views illustrating other examples of an opening of an inorganic film.
Figure 5B:
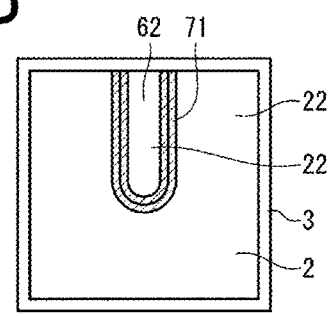
Figure 6:
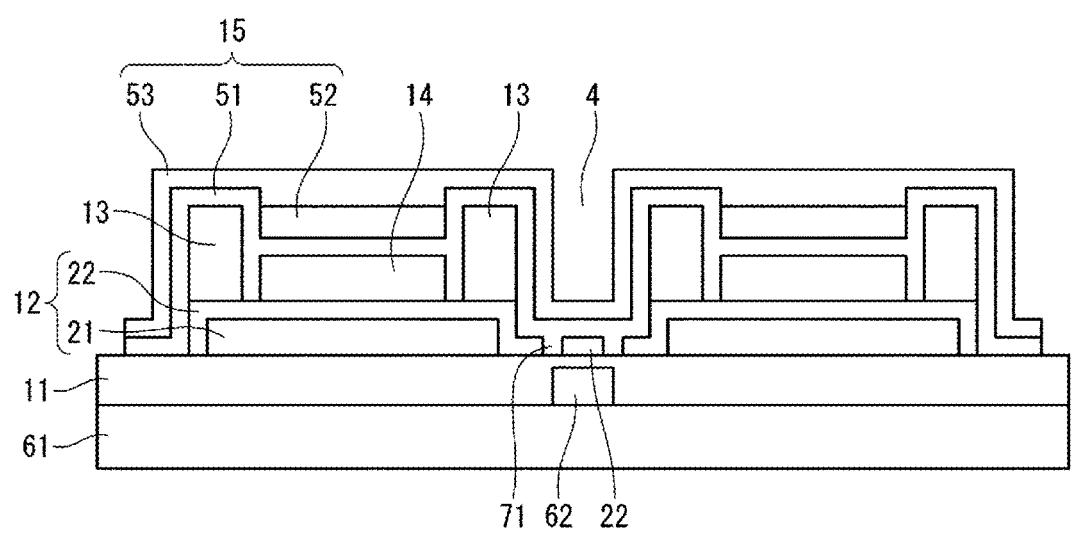
FIG. 6 is a sectional view illustrating another example of the opening of the inorganic film.

FIGS. 5A and 5B are plan views illustrating other examples of the opening 71 of the inorganic film 22. FIG. 6 is a sectional view illustrating another example of the opening 71 of the inorganic film 22. In FIG. 5A to FIG. 6, the forming of the TFT layer 12 includes forming the inorganic film 22 including the opening 71 only at the position corresponding to the end portion of the protrusion 62. Also in this case, the inorganic film 22 does not overlap the end portion of the protrusion 62, and it is therefore not necessary to cut out the inorganic film 22 when the resin film 11 is peeled off. Therefore, when the resin film 11 is peeled off, it is possible to prevent cracking in the inorganic film 22 and propagation of such cracking to the display region 2.

Another Method of Manufacturing Display Device 1

Figure 7A:
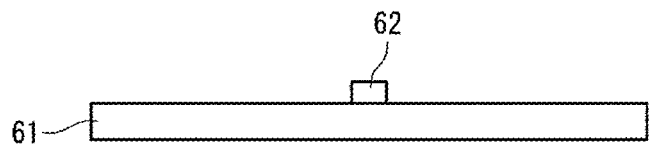
FIGS. 7A to 7E illustrate a method of manufacturing the display device.
Figure 7B:
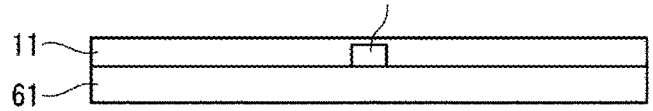

FIGS. 7A to 7E illustrate another method of manufacturing the display device 1. First, as illustrated in FIG. 7A, the protrusion 62 is formed on the surface of the glass substrate 61. This formation is performed the same as in FIG. 3A. After the protrusion 62 is formed, the resin film 11 is formed on the surface of the glass substrate 61 as illustrated in FIG. 7B. This formation is performed the same as in FIG. 3B.

Figure 7C:
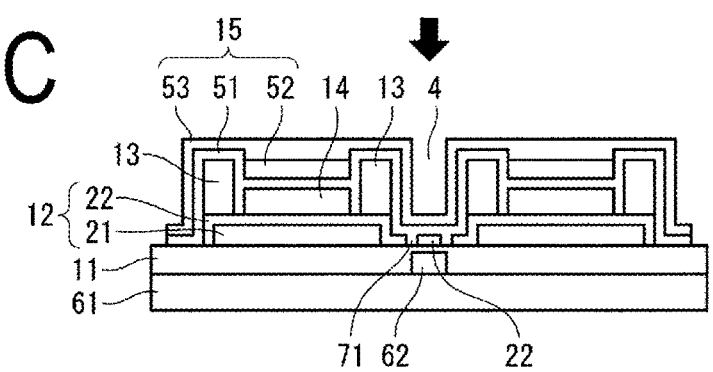

After the resin film 11 is formed, the TFT layer 12, the bank 13, the display element layer 14, and the sealing film 15 are sequentially formed on the resin film 11 as illustrated in FIG. 7C. Basically, they are formed the same as in FIG. 3C. Note that, in FIG. 7C, the inorganic film 22 including the opening 71 only at the position corresponding to the end portion of the protrusion 62 is formed. Therefore, the inorganic film 22 surrounded by the opening 71 overlaps the protrusion 62 with the resin film 11 therebetween.

Figure 7D:
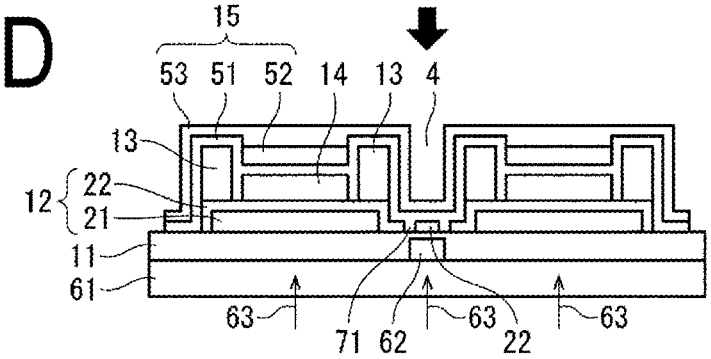
Figure 7E:
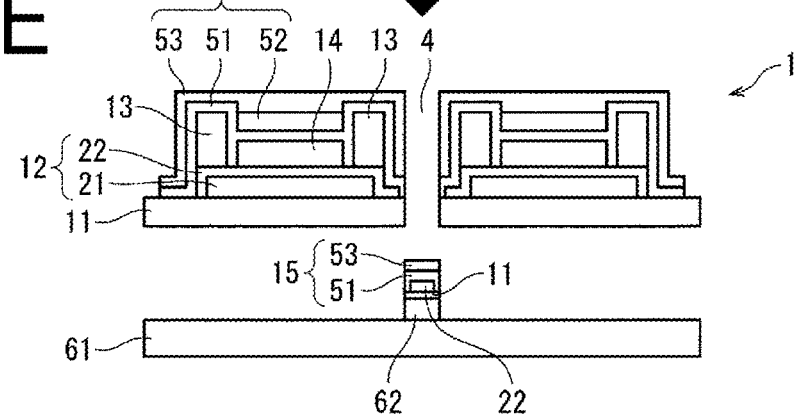

After the sealing film 15 is formed, the rear surface of the glass substrate 61 is irradiated with the laser beam 63 as illustrated in FIG. 7D. This irradiation is performed the same as in FIG. 3D. By irradiation with the laser beam 63, the resin film 11 can be peeled from the glass substrate 61 as illustrated in FIG. 7E. Then, the protrusion 62 and the resin film 11 overlapping the protrusion 62 are left on the glass substrate 61. Also, the inorganic film 22, the inorganic film 51, and the inorganic film 53 overlapping the protrusion 62 are left on the glass substrate 61. Thus, the display device 1 illustrated in FIG. 6 is manufactured.

Tilted Protrusion 62

Figure 8:
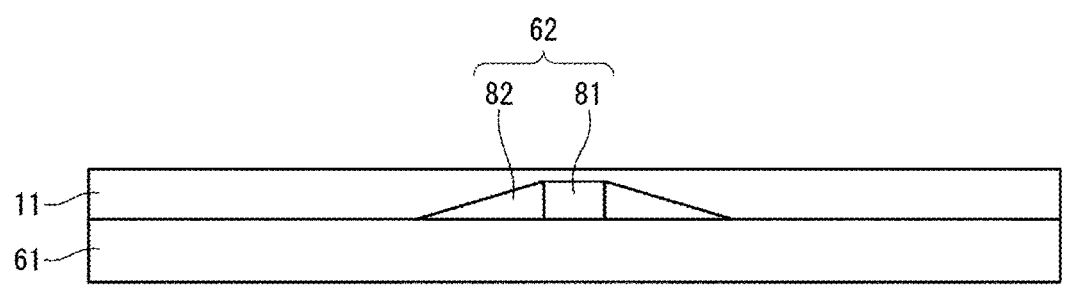
FIG. 8 is a sectional view illustrating a protrusion including a flat portion and a tilted portion.

FIG. 8 is a sectional view illustrating the protrusion 62 including a flat portion 81 and a tilted portion 82. In FIG. 8, the protrusion 62 includes the flat portion 81 and the tilted portion 82. The tilted portion 82 is tilted from the top face of the protrusion 62 toward the bottom face of the protrusion 62 (the surface of the glass substrate 61) at an angle θ of 30° or smaller. With the tilted portion 82 disposed on the glass substrate 61, the resin film 11 that is sufficiently flat and thin can be formed on the protrusion 62. Further, at the tilted portion 82, the adhesion of the resin film 11 to the protrusion 62 gradually increases from the end portion remotest from the glass substrate 61 toward the end portion closest to the glass substrate 61. With this configuration, when the resin film 11 is peeled from the glass substrate 61, damages such as cracking are less caused in the inorganic film 22 disposed above the resin film 11. Thus, the yields of the display device 1 can be increased.

Supplement

A method of manufacturing a display device according to a first aspect of the disclosure includes: forming a protrusion composed of a first material in a portion on a glass substrate; forming a resin film composed of a second material on the glass substrate and the protrusion, the second material being different from the first material; forming a TFT layer on the resin film; forming a display element layer on the TFT layer; forming a sealing film on the display element layer; and peeling the resin film from the glass substrate by irradiating a rear surface of the glass substrate with a laser beam. The peeling including leaving the protrusion and the resin film formed on the protrusion on the glass substrate.

With the configuration, the resin film overlapping the protrusion can be easily cut out from the main body of the resin film.

In a manufacturing method according to a second aspect in the manufacturing method according to the first aspect, the TFT layer includes an inorganic film; the forming of the TFT layer includes forming the inorganic film including an opening at a portion corresponding to an end portion of the protrusion; and the forming of the protrusion includes avoiding the end portion of the protrusion from overlapping the inorganic film.

With the configuration, when the resin film is peeled off, cracking in the inorganic film and propagation of such cracking to the display region can be prevented.

In a manufacturing method according to a third aspect in the manufacturing method according to the first aspect, the forming of the sealing film includes forming a first inorganic film, forming an interlayer resin film in an ink-jet manner, and forming a second inorganic film; the forming of the TFT layer includes forming a bank configured to stem the interlayer resin film; the display device includes a display region and a frame region that surrounds the display region; an end portion of the display region is opposite the bank; and the forming of the protrusion includes forming the protrusion between each of the different bank on the glass substrate.

With the configuration, the display element layer does not overlap the protrusion, and therefore, when the resin film is peeled from the glass substrate, damage to the display element layer can be prevented.

In a manufacturing method according to a fourth aspect in the manufacturing method according to the third aspect, the peeling includes leaving the first inorganic film and the second inorganic film that overlap the protrusion on the glass substrate.

With the configuration, the sealing film overlapping the protrusion can be cut out from the main body of the sealing film.

In a manufacturing method according to a fifth aspect in the manufacturing method according to any one of the first to fourth aspects, the display device includes a display region and a frame region that overlaps the display region; and the forming of the protrusion includes forming the protrusion inside the display region.

With the configuration, a display device including a blank portion formed inside the display region can be manufactured.

In a manufacturing method according to a sixth aspect in the manufacturing method according to the fifth aspect, the forming of the protrusion includes forming the protrusion in a substantially circular shape.

With the configuration, a display device including a blank portion having a substantially circular shape can be manufactured.

In a manufacturing method according to a seventh aspect in the manufacturing method according to any one of the first to fourth aspects, the display device includes a display region and a frame region that overlaps the display region; and in the forming of the protrusion, the protrusion cut out from the frame region to the display region is formed.

With the configuration, a display device including a blank portion cut out from the frame region into the display region can be manufactured.

In a manufacturing method according to an eighth aspect in the manufacturing method according to any one of the first to seventh aspects, the forming of the resin film includes forming the resin film such that a thickness of the resin film overlapping the protrusion is 0.5 µm or smaller.

With the configuration, the resin film can be easily peeled from the glass substrate.

In a manufacturing method according to a ninth aspect in the manufacturing method according to any one of the first to eighth aspects, the protrusion includes a tilted portion that is tilted at an angle of 30 degrees or smaller from a top face of the protrusion toward a bottom face of the protrusion.

With the configuration, when the resin film is peeled from the glass substrate, damages such as cracking in the inorganic film disposed on the resin film are less caused, and thus the yield of the display device can be increased.

In a manufacturing method according to a tenth aspect in the manufacturing method according to any one of the first to ninth aspects, the first material is a metal.

With the configuration, the resin film overlapping the protrusion can be easily cut out from the main body of the resin substrate.

In a manufacturing method according to an eleventh aspect in the manufacturing method according to any one of the first to tenth aspects, the second material is polyimide.

A display device according to a twelfth aspect manufactured by the manufacturing method according to any one of the first to eleventh aspects.

The disclosure is not limited to the embodiments, and various modifications may be made within the scope of the claims. Embodiments obtained by appropriately combining technical approaches stated in each of the different embodiments also fall within the scope of the technology of the disclosure. Novel technical features may be formed by combining the technical approaches stated in each of the embodiments.

REFERENCE SIGNS LIST

1 Display device
11 Resin film
12 TFT layer
13 Bank
14 Display element layer
15 Sealing film
21 Semiconductor layer
22 Inorganic film
51 Inorganic film
52 Interlayer resin film
53 Inorganic film
61 Glass substrate
62 Protrusion
63 Laser beam

The invention claimed is:

1. A method of manufacturing a display device comprising:
   forming a protrusion composed of a first material in a portion on a glass substrate;
   forming a resin film composed of a second material on the glass substrate and the protrusion, the second material being different from the first material;
   forming a TFT layer on the resin film;
   forming a display element layer on the TFT layer;
   forming a sealing film on the display element layer; and
   peeling the resin film from the glass substrate by irradiating a rear surface of the glass substrate with a laser beam, wherein
   the peeling includes leaving the protrusion and the resin film formed on the protrusion on the glass substrate,
   the TFT layer includes an inorganic film,
   the forming of the TFT layer includes forming the inorganic film to include an opening at a portion corresponding to the protrusion, and
   the protrusion and the inorganic film do not overlap.

2. The manufacturing method according to claim 1, wherein
   the forming of the sealing film includes:
      forming a first inorganic film,
      forming an interlayer resin film in an ink-jet manner, and
      forming a second inorganic film,
   the forming of the TFT layer includes forming a bank configured to stem the interlayer resin film,
   the display device includes a display region and a frame region that surrounds the display region,
   an end portion of the display region is opposite the bank, and
   the forming of the protrusion includes forming the protrusion between two different portions of the bank on the glass substrate.

3. The manufacturing method according to claim 2, wherein the peeling includes leaving the first inorganic film and the second inorganic film that overlap the protrusion on the glass substrate.

4. The manufacturing method according to claim 1, wherein
   the display device includes a display region and a frame region that surrounds the display region, and
   the forming of the protrusion includes forming the protrusion inside the display region.

5. The manufacturing method according to claim 4, wherein the forming of the protrusion includes forming the protrusion in a substantially circular shape.

6. The manufacturing method according to claim 1, wherein
   the display device includes a display region and a frame region that surrounds the display region, and
   the forming of the protrusion includes forming the protrusion to have a shape extending from a boundary between the display region and the frame region toward the display region.

7. The manufacturing method according to claim 1, wherein the forming of the resin film includes forming the resin film such that a thickness of the resin film overlapping the protrusion is 0.5 µm or smaller.

8. The manufacturing method according to claim 1, wherein the protrusion includes a tilted portion that is tilted at an angle of 30 degrees or smaller from a top face of the protrusion toward a bottom face of the protrusion.

9. The manufacturing method according to claim 1, wherein the first material is a metal.

10. The manufacturing method according to claim 1, wherein the second material is polyimide.

* * * * *